US00RE35781E

United States Patent [19]

Ono et al.

[11] E Patent Number: Re. 35,781

[45] Reissued Date of Patent: May 5, 1998

[54] CODING METHOD OF IMAGE INFORMATION

[75] Inventors: Fumitaka Ono; Shigenori Kino; Masayuki Yoshida; Tomohiro Kimura, all of Kamakura, Japan

[73] Assignee: Mitsubishi Denki Kabushiki Kaisha, Tokyo, Japan

[21] Appl. No.: 553,235

[22] Filed: Nov. 7, 1995

Related U.S. Patent Documents

Reissue of:

[64] Patent No.: 5,059,976
Issued: Oct. 22, 1991
Appl. No.: 470,099
Filed: Jan. 25, 1990

U.S. Applications:

[63] Continuation of Ser. No. 139,561, Oct. 20, 1993, abandoned.

[30] Foreign Application Priority Data

Jan. 31, 1989 [JP] Japan ..... 1-21672

[51] Int. Cl.[6] ..... H03M 7/34

[52] U.S. Cl. ..... 341/51; 341/107; 358/261.2

[58] Field of Search ..... 341/51, 67, 106, 341/107; 358/430, 261.2; 375/240

[56] References Cited

U.S. PATENT DOCUMENTS

| | | | |
|---|---|---|---|
| 4,028,731 | 6/1977 | Arps et al. | 358/261.2 X |
| 4,070,694 | 1/1978 | Sakamoto et al. | 358/261.2 X |
| 4,099,257 | 7/1978 | Arnold et al. | 341/67 X |
| 4,177,456 | 12/1979 | Fukinuki et al. | 341/67 |
| 4,191,974 | 3/1980 | Ono et al. | 358/261 |
| 4,286,256 | 8/1981 | Langdon, Jr. et al. | 358/261.2 |
| 4,355,306 | 10/1982 | Mitchell | 358/261.2 |
| 4,905,297 | 2/1990 | Langdon, Jr. et al. | 358/261.2 |
| 4,933,883 | 6/1990 | Pennebaker et al. | 341/107 |

OTHER PUBLICATIONS

Pennebaker et al., An Overview of the Basic Priciples of the Q-Coder Adaptive Binary Arithmetic Coder, IBM Journal of Research and Development, vol. 32, No. 6, Nov. 1988, pp. 717–726.

K. S. Fu et al., *Robotics: Control, Sensing, Vision, and Intelligence*, McGraw-Hill Book Company, New York, copyright 1987, pp. 342–351.

*Primary Examiner*—Howard L. Williams
*Attorney, Agent, or Firm*—Wolf, Greenfield & Sacks, P.C.

[57] ABSTRACT

A coding method of a binary Markov information source comprises the steps of providing a range on a number line from 0 to 1 which corresponds to an output symbol sequence from the information source, and performing data compression by binary expressing the position information on the number line corresponding to the output symbol sequence. The present method further includes the steps of providing a normalization number line to keep a desired calculation accuracy by expanding a range of the number line which includes a mapping range, by means of a multiple of a power of 2, when the mapping range becomes below 0.5 of the range of the number line; allocating a predetermined mapping range on the normalization number line for less probable symbols LPS proportional to its normal occurrence probability; allocating the remaining mapping range on the normalization number line for more probable symbols MPS; and reassigning the predetermined mapping range to the remaining mapping range the half of a portion where the allocated remaining range is less than 0.5, when the allocated remaining range becomes below 0.5.

14 Claims, 5 Drawing Sheets

$$S = \frac{HALF}{2^n} = \frac{1}{2^{n+1}}$$

GENERATION OF A CODE WORD

```
  0101
     1000
+      0100
 -------------
  0111100
```

→ OUTPUT CODE WORD

CODING METHOD OF IMAGE INFORMATION

Matter enclosed in heavy brackets [ ] appears in the original patent but forms no part of this reissue specification; matter printed in italics indicates the additions made by reissue.

*This application is a continuation of application Ser. No. 08/139,561, filed Oct. 20, 1993, now abandoned.*

BACKGROUND OF THE INVENTION

1. Field of the Invention

This invention relates to a coding method of image information or the like.

2. Description of Related Art

For coding a Markov information source, the number line representation coding system is known in which a sequence of symbols is mapped on the number line from 0.00 to 1.0 and its coordinates are coded as code words which are, for example, represented in a binary expression. FIG. 1 is a conceptual diagram thereof. For simplicity a bi-level memoryless information source is shown and the occurrence probability for "1" is set at r, the occurrence probability for "0" is set at 1−r. When an output sequence length is set at 3, the coordinates of each of the rightmost C(000) to C(111) is represented in a binary expression and cut at the digit which can be distinguished each other, and is defined as its respective code words, and decoding is possible at a receiving side by performing the same procedure as at the transmission side.

In such a sequence, the mapping interval $A_i$, and the lower-end coordinates $C_i$ of the symbol sequence at time i are given as follows:

When the output symbol ai is 0 (More Probable Symbol: hereinafter called MPS).

$$A_i=(1-r)A_{i-1}$$

$$[C_i=C_{i-1}]C_i=C_{i-1}+rA_{i-1}$$

When the output symbol ai is 1 (Probable Symbol: hereinafter called LPS), $$A_i=rA_{i-1}$$

$$[C_i=C_{i-1}+(1-r)A_{i-1}]C_i=C_{i-1}$$

As described in "an overview of the basic principles of the Q-Coder adaptive binary arithmetic coder (IBM journal of Research and Development Vol. 32, No. 6, November, 1988)", it is considered that in order to reduce the number of calculations such as multiplication, a set of fixed values are prepared and a certain value is selected from among them, not necessarily calculating $rA_{i-1}$.

That is, if $rA_{i-1}$ of the above-mentioned expression is set at S, when ai=0, $$A_i=A_{i-1}-S$$

$$[C_i=C_{i-1}]C_i=C_{i-1}+S$$

when ai=1, $$A_i=S$$

$$[C_i=C_{i-1}+(A_{i-1}-S)]C_i=C_{i-1}$$

However, as $A_{i-1}$ becomes successively smaller, S is also needed to be smaller in this instance. To keep the calculation accuracy, it is necessary to multiply $A_{i-1}$ by the second power (hereinafter called normalization). In an actual code word, the above-mentioned fixed value is assumed to be the same at all times and is multiplied by powers of ½ at the time of calculation (namely, shifted by a binary number).

If a constant value is used for S as described above, a problem arises when, in particular, S is large and a normalized $A_{i-1}$ is relatively small.

An example thereof is given in the following. If $A_{i-1}$ is slightly above 0.5, $A_i$ is very small when ai is an MPS, and is even smaller than the area being given when ai is LPS. That is, in spite of the fact that the occurrence probability of MPS is essentially high, the area allocated to MPS is smaller than that allocated to LPS, leading to an decrease in coding efficiency. If it is assumed that an area allocated to MPS is always larger than that allocated to LPS, since $A_{i-1}>0.5$, S must be 0.25 or smaller. Therefore, when $A_{i-1}$ is 1.0, r=0.25, and when $A_{i-1}$ is close to 0.5, r=0.5, with the result that the occurrence probability of LPS is considered to vary between ¼ and ½ in coding. If this variation can be made small, an area proportional to an occurrence probability can be allocated and an improvement in coding efficiency can be expected.

SUMMARY OF THE INVENTION

The present invention has been devised to solve the above-mentioned problems, and in particular, it is directed at an increase in efficiency when the occurrence probability of LPS is close to ½.

Accordingly, it is an object of the present invention to provide a coding system which, in the case where the range provided to a more probable symbol is below 0.5 on a normalized number line, by moving half of the portion where the allocated area of the more probable symbol is below 0.5 to the range of a more probable symbol from the range of LPS, a coding based on the occurrence probability of LPS can be performed.

According to the present invention, by changing S according to the value of $A_{i-1}$, r is stabilized and coding in response to the occurrence probability of LPS can be performed. According to the present invention, in particular when r is ½, coding in which r is assumed ½ at all times rather than based on $A_{i-1}$, can be performed, and high efficiency can be expected.

Also, according to the present invention, in the number line coding, an area allocated to LPS can be selected depending on the occurrence probability of LPS, therefore it has an advantage in that efficient coding can be realized.

EMBODIMENT

Figure 1:
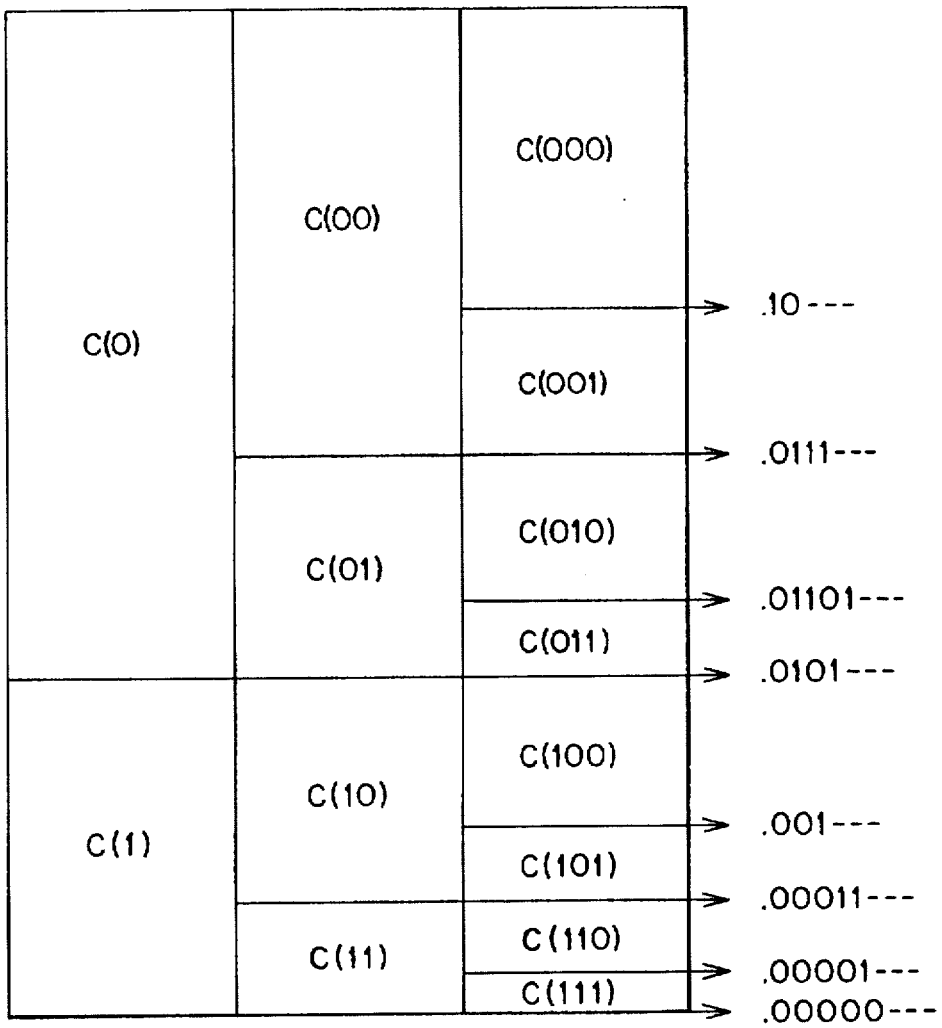
FIG. 1 is a view of the prior art illustrating the concept of a number line coding.
Figure 2:
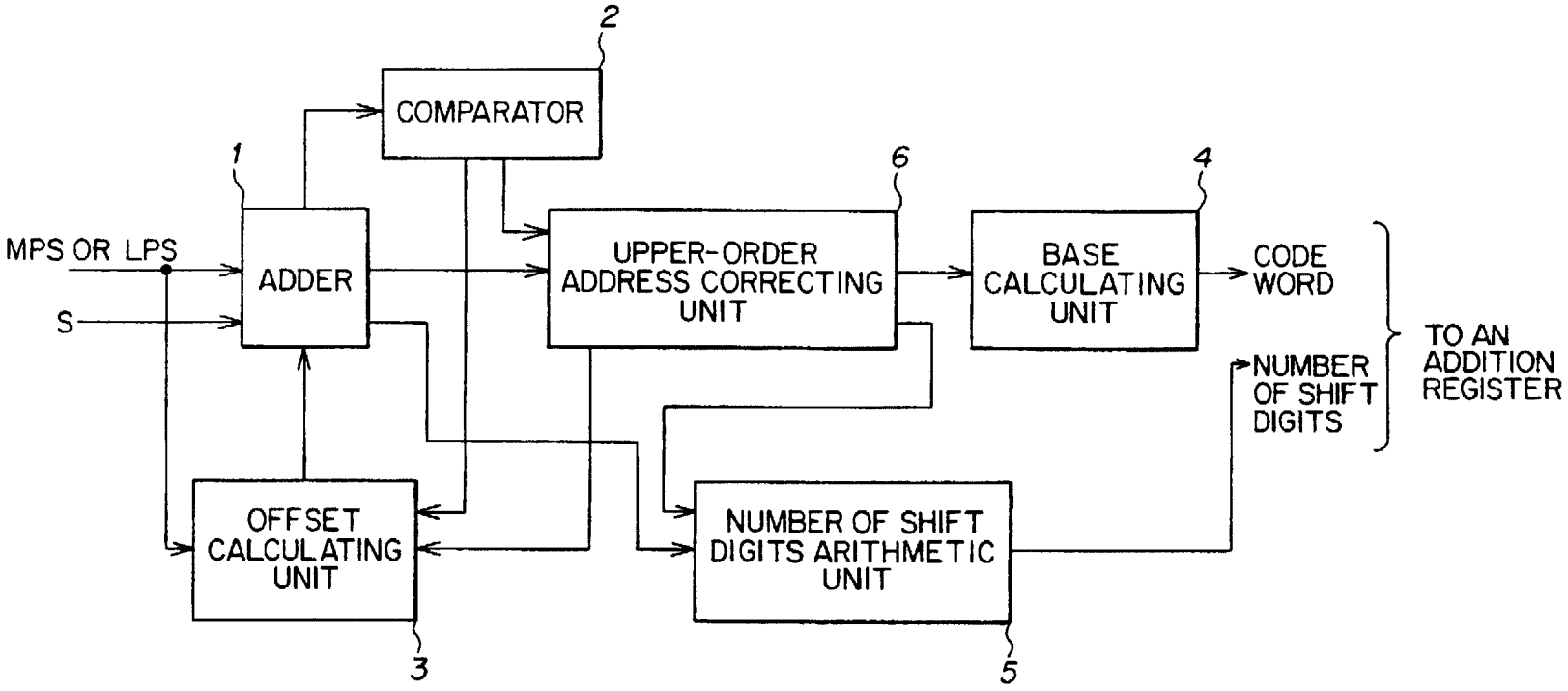
FIG. 2 is a view illustrating a coding device in accordance with one embodiment of the present invention.

FIG. 2 shows one embodiment of the present invention. An adder 1 adds the value of S, which is input thereto, and the output of an offset calculating unit 3 to calculate the upper-limit address of LPS. A comparator 2 compares the calculated value with 0.5. When the value is 0.5 or smaller and an occurrence symbol is MPS, the processing of the offset calculating unit 3 is stopped at the addition of the above-mentioned S. Similarly, if the comparator 2 judges that the value is 0.5 or smaller and the occurrence symbol is LPS, the base calculating unit 4 performs a base calculation and outputs the base coordinates as codes. A number of shift digits calculating unit 5 determines a multiple ($2^n$ times) required for normalization (makes the effective range 0.5 to 1.0) from the value of S and outputs it as the number of shift digits.

Figure 3:
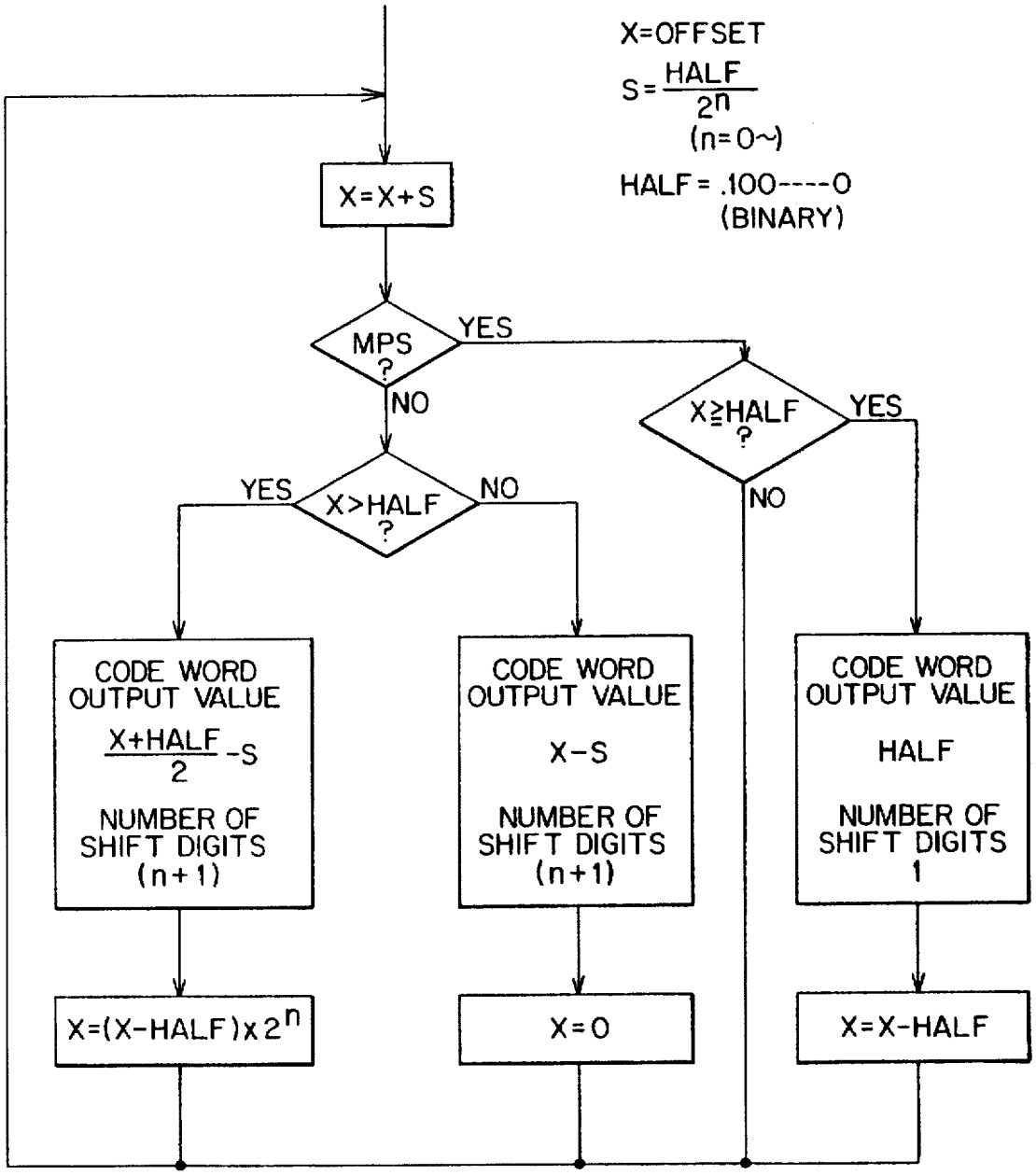
FIG. 3 is a flow chart for coding of one embodiment of the present invention.
Figure 4:
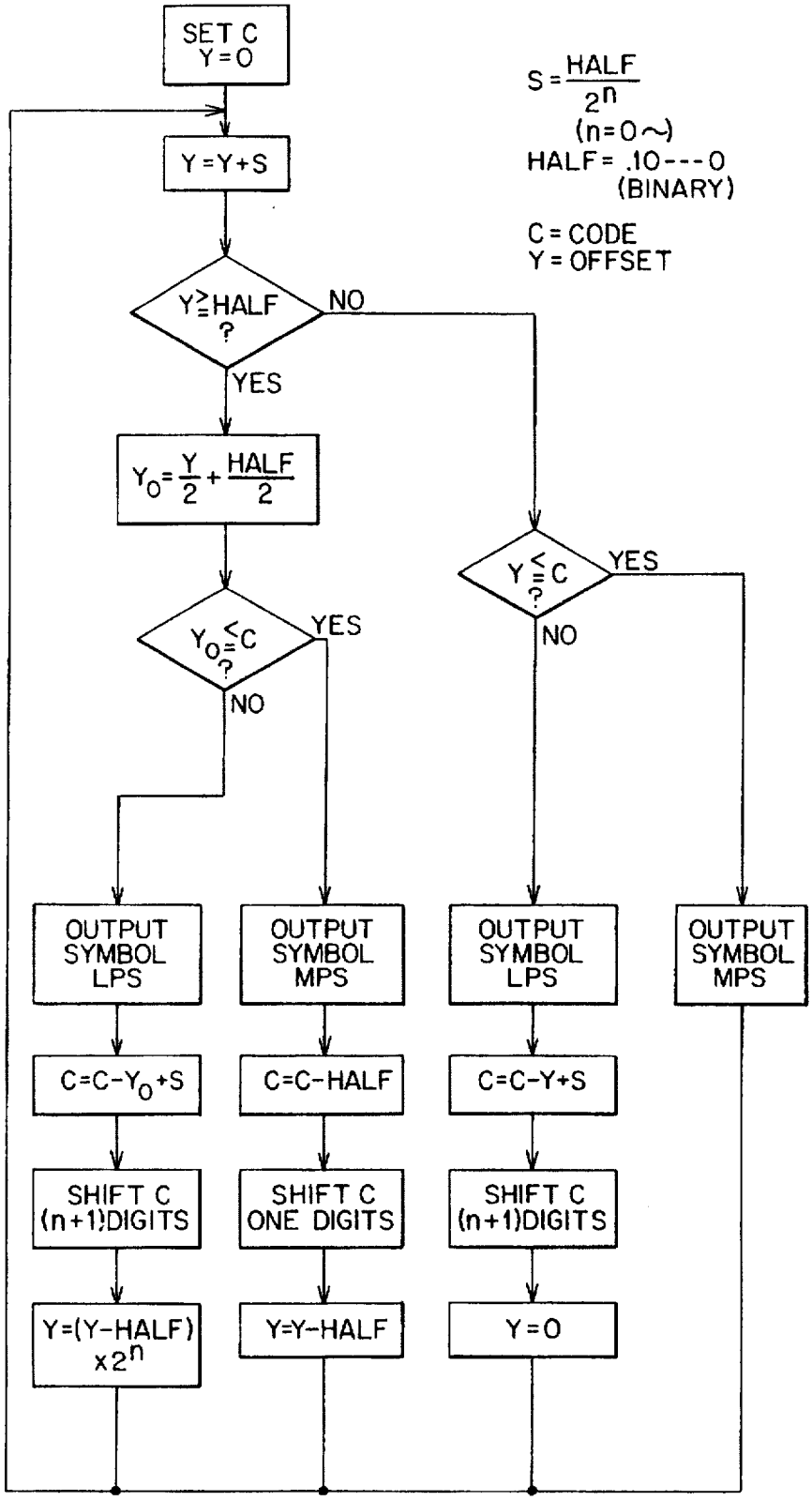
FIG. 4 is a flow chart of decoding in one embodiment of the present invention.

Next, when the comparator 2 judges the value to be above 0.5 (decimal), the upper-limit address of LPS is corrected by LPS upper-limit address correcting unit 6. A base calculation is performed by the base calculating unit 4 to output the base coordinates therefrom. A shift digit calculating is performed by the number of shift digits calculating unit 5 to output the number of shift digits therefrom. Then, the output base coordinates are processed in an addition register (not shown) to form a code word. The number of shift digits which has been output from the unit 5, indicates how many digits of a code word to be next output are shifted. The code word is then added in the register. To more accurately explain the above-described process, flowcharts for coding and decoding are shown in FIGS. 3 and 4, respectively. In each of these flowcharts the where S is defined as a power of ½ is illustrated.

Figure 5:
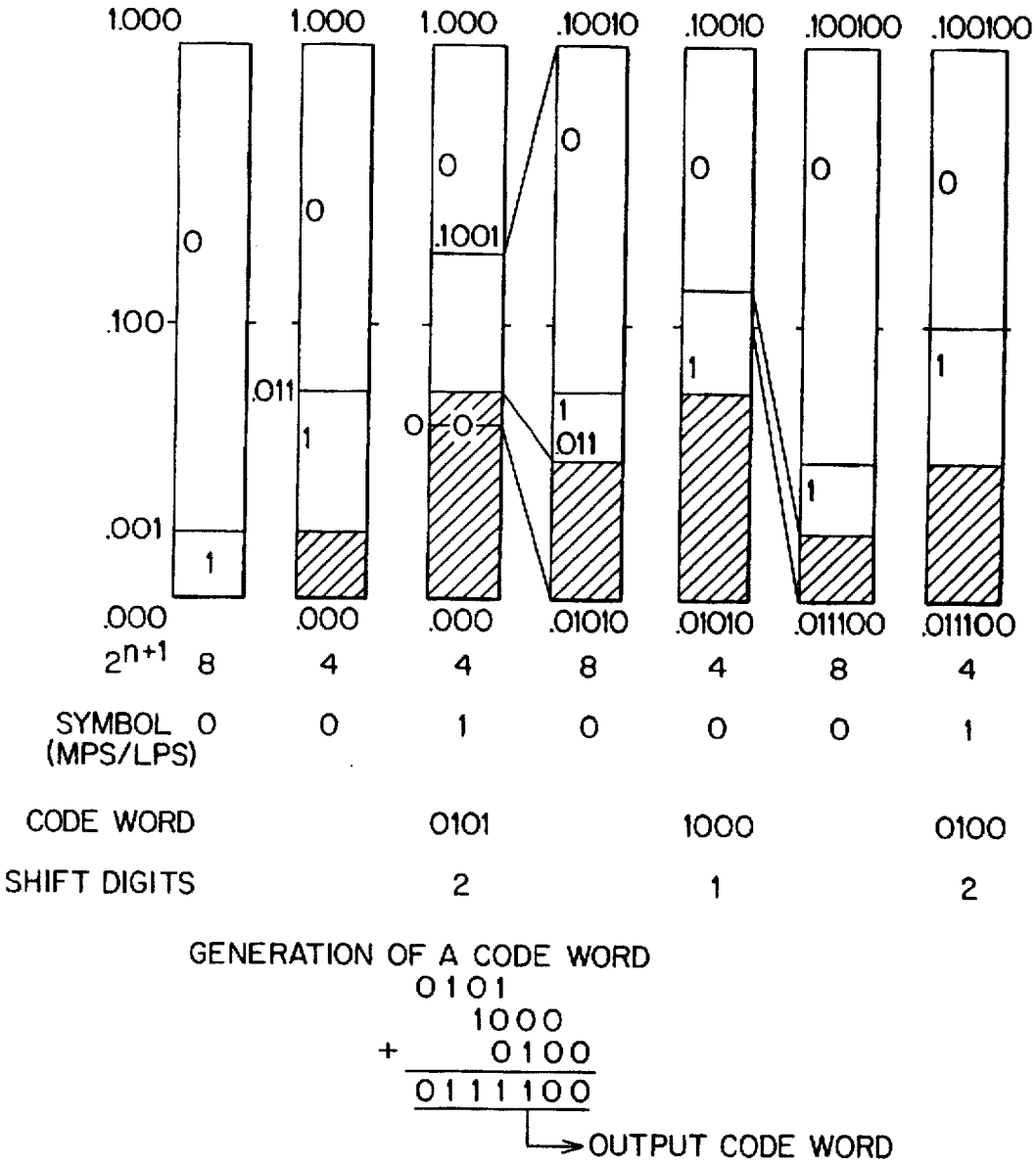
FIG. 5 is an example of an operation in one embodiment of the present invention.

Next, a concrete example of coding will be explained. Suppose that, in FIG. 5, the coordinates are expressed in a binary system and that S is set at ⅛ or ¼. First if S=⅛ is known from the Markov state in a Markov information source then 1 (LPS) is assigned to from [0.001] *0.000* to 0.001 and 0 (MPS) is assigned to from 0.001 to 1.000. Now, if a 0 symbol occurs, the range is limited to between 0.001 to 1.000. At this time, the offset value is 0.001. For the next symbol, since it is known from the occurrence probability of 1, that S=¼ is used in both reception and transmission 1 is assigned to from 0.001 to 0.011. At this point, if 0 occurs, the range of the number line varies from 0.011 to 1.000 Next, if S=¼, the upper limit of the allocated range of LPS is 0.011+0.01=0.101 which exceeds 0.1 (0.5 in decimal). So a correction in which the portion exceeding 0.1 is halved is made, and the upper limit becomes 0.1001. At this point, LPS has occurred and the size of the area of LPS is 0.1001−0.011=0.0011. So if it is multiplied by $2^2$, it exceeds 0.1 (0.5 in decimal). Therefore, the number of shift digits is 2. The base value is 0.1001−0.01=0.0101 and this value is output as a code word. A new offset value becomes 0.01, since 0.011−0.0101=0.0001 is shifted by two digits. Next, S is set at [¼]⅛ and 0.01+0.001=0.011 becomes the border between 0 and 1. If 0 occurs at this point, the offset value is increased to 0.011. If S is set at ¼ at this point, this results in 0.011+0.01=0.101, which exceeds 0.1. [If] *As* the portion exceeding 0.1 is halved, the value becomes 0.1001. Since the area of 0 is less than 0.1 if the symbol is 0, [1000 corresponding to] a base value 0.1000 must be output as an output, and then it must be normalized $2^1$ times. In other words, 0.1000 is a base value, so a new offset value is 0.001, which is $2^1$ times (0.1001−0.1). Suppose that the next state is S=[¼] ⅛ and MPS has occurred, then the [offset value is 0.0001] *border value is 0.001*+0.001=0.010. Further, suppose that the next state is S=¼ and 1 (LPS) has occurred, an offset value 0.0100 is output as a code word.

A final code word becomes one which is calculated on the basis of the number of shift digits and the code words which are output as explained above (refer to the lower portion of FIG. 5).

If the value of S is selected from a set of values which are powers of ½, such as ½, ¼, or ⅛, the multiples of powers of 2 for normalization can be constant, even if the value of S is varied by the correction when the allocated area of MPS is below 0.5 on the normalization number line. This is advantageous.

When an area is provided to 0 (MPS) and 1 (LPS) according to the above-described manner, the relationship between the value of S and the assumed occurrence probability of LPS when S is determined, is given as follows:

$$S \leqq r < S/(½+S)$$

Therefore, when S=½, [r ½] *r*=½, which indicates it is stable.

$$\text{If } S=¼,\ ¼ \leqq r < ½.$$

On the ocher hand, if S is fixed in a conventional manner, the assumed occurrence probability r becomes as follows:

$$S \leqq r < S/(½) = 2S$$

$$\text{If } S=½,\ ½ \leqq r < ½,$$

$$\text{If } S=¼,\ ¼ \leqq r < 1.$$

That is, since the variation range of r is larger for a conventional system, the system of the present invention is more efficient.

The multi-level information source can be converted into a binary information source by tree development. Therefore, it goes without saying that the present invention can be applied to a multi-level information source.

What is claimed is:

1. A method for coding information from a binary Markov information source by binary coding an output symbol sequence from said information source comprising less probable symbols (LPS) and more probable symbols (MPS), each having an occurrence probability, on a normalization number line, said method comprising the steps of;

a) storing in a memory storage device a normalization number line having a range from 0 to 1 which corresponds to said output symbol sequence, b) keeping a desired calculation accuracy by expanding a range of the normalization number line which includes a mapping range by means of a multiple of a power of 2 when the mapping range becomes less than 0.5, c) allocating a portion of said normalization number line as a predetermined mapping interval for said LPSs, said portion being proportional to the occurrence probability of said LPSs, d) allocating the remaining portion of said number line as a mapping interval for said MPSs, e) reassigning half of the LPS mapping interval above 0.5 to said MPS mapping interval when the LPS mapping range exceeds 0.5, and f) repeating steps b, c, d and e.

2. A coding method as set forth in claim 1 whereas said LPS mapping interval is a power of ½ of the range of said number line.

3. A coding method as set forth in claim 1 further including the steps of assigning as an offset value the difference between 1 and the [LPS] mapping interval after *a current* step [(e)] (*b*), and coding a base value [for subsequent use for] *as a codeword by* calculating the offset value *as a codeword* by [subtracting said offset value from] *using the difference between* the [lower] *upper* limit of said [MPS] mapping range *just after a previous step (b) and a lower limit of mapping range just* before [normalization] *the current step (b).*

4. An apparatus for coding information from a binary Markov information source by binary coding an output symbol sequence comprising less probable symbols (LPSs) and more probable symbols (MPS) from said information source on a normalization number line, said LPSs and MPSs each having an occurrence probability, said apparatus comprising:

memory storage means for storing a normalization number line having a range from 0 to 1 which corresponds to said output symbol sequence, means for keeping desired calculation accuracy by expanding a range on said normalization number line, which includes a mapping range, by a multiple power of 2 when the mapping range becomes less than 0.5, means for allocating a portion of said normalization number line as a predetermined mapping interval for said LPSs, said portion being proportional to the occurrence probability of said LPSs, means for allocating the remaining portion of said normalization number line as a mapping interval for said MPSs, means for reassigning half of the LPS mapping interval above 0.5 to said MPS mapping interval when said LPS mapping interval exceeds 0.5.

5. An apparatus as set forth in claim 4 wherein said LPS mapping interval is a power of ½ of the range of said number line.

6. An apparatus as set forth in claim 4 further comprising means for assigning an offset value, said offset value being the difference between 1 and the [LPS] *mapping* interval [before reassignment of the LPS mapping interval] *after the range of the normalization number line is expanded*, and means for coding a base value [for subsequent use for calculating the offset value after reassignment of the LPS mapping interval by subtracting said offset value from the] *as a codeword by using the difference between the upper limit of the mapping range just after a previous expansion of the normalization number line and a* lower limit of said [MPS] mapping range before [normalization] *expansion.*

*7. A method for coding information from a Markov information source by binary coding an output symbol sequence from said information source comprising less probable symbols (LPSs) and more probable symbols (MPSs), each sequence having an occurrence probability on a number line, said method comprising,*

*(a) storing in memory storage device a number line having a range which corresponds to said output symbol sequence;*

*(b) allocating a portion of said number line as a predetermined mapping interval for said LPSs, said portion being proportional to the occurrence probability of said LPS;*

*(c) allocating the remaining portion of said number line as a mapping interval for said MPSs; and*

*(d) controlling the allocating portion of said number line as a mapping interval for said LPSs by assigning a predetermined portion of the mapping interval for said LPSs above a prescribed value of said number line to said mapping interval for said MPSs, so as to maintain said portion proportional to the occurrence probability of said LPSs.*

*8. An apparatus for coding information from a Markov information source by binary coding an output symbol sequence from said information source comprising less probable symbols (LPSs) and more probable symbols (MPSs) from said information source on a number line, said LPSs and MPSs each having an occurrence probability, said apparatus comprising:*

*memory storage means for storing a number line having a range which corresponds to said output symbol sequence;*

*means for allocating a portion of said number line as a predetermined mapping interval for said LPSs, said portion being proportional to the occurrence probability of said LPSs;*

*means for allocating the remaining portion of said number line as a mapping interval for said MPSs; and*

*control means for controlling the allocating portion of said number line as a mapping interval for said LPSs by assigning a predetermined portion of the mapping interval for said LPSs above a prescribed value of said number line to said mapping interval for said MPSs, so as to maintain said portion proportional to the occurrence probability of said LPSs.*

*9. A method for coding information from a Markov information source by binary coding an output symbol sequence from said information source comprising less probable symbols (LPSs) and more probable symbols (MPSs) each having an occurrence probability on a number line, said method comprising,*

*(a) storing in memory storage device a number line having a range which corresponds to said output symbol sequence;*

*(b) allocating a a portion of said number line as a predetermined mapping interval for said LPSs, said portion being proportional to the occurrence probability of said LPSs;*

*(c) allocating the remaining portion of said number line as a mapping interval for said MPSs; and*

*(d) reassigning half of the LPSs mapping interval above a prescribed value to said MPSs mapping interval when the LPSs mapping range exceeds the prescribed value, and*

*(e) repeating steps b, c, and d.*

*10. An apparatus for coding information from a Markov information source by binary coding an output symbol sequence from said information source comprising less probable symbols (LPSs) and more probable symbols (MPSs) from said information source on a number line, said LPSs and MPSs each having an occurrence probability, said apparatus comprising:*

*memory storage means for storing a number line having a range which corresponds to said output symbol sequence;*

*means for allocating a a portion of said number line as a predetermined mapping interval for said LPSs, said portion being proportional to the occurrence probability of said LPSs;*

*means for allocating the remaining portion of said number line as a mapping interval for said MPSs; and*

*means for reassigning half of the LPSs mapping interval above a prescribed value to said MPSs mapping interval when said LPSs mapping range exceeds the prescribed value.*

*11. A decoding method for a Markov information source coded by binary coding comprising the steps of:*

*associating more probable symbols (symbols of a higher occurrence probability) and less probable symbols (symbols of a lower occurrence probability) to predetermined ranges on a number line on the basis of a range on a number line for a preceding symbols;*

*outputting a decoding signal according to a result of correspondence between the ranges and an inputted codeword;*

*comparing the range on the number line of more probable symbols with the range on the number line of less probable symbols; and*

*adjusting the range on the number line of less probable symbols and the range on the number line of more probable symbols by assigning predetermined portion of the range for said less probable symbols above a prescribed value of said number line to said range for said more probable symbols so that the range on the number line of less probable symbols does not exceed that of the more probable symbols.*

*12. A decoding method for a Markov information source coded by binary coding comprising the steps of:*

*associating more probable symbols (symbols of a higher occurrence probability) and less probable symbols (symbols of a lower occurrence probability) to predetermined ranges on a number line on the basis of a range on a number line for a preceding symbols;*

*outputting a decoding signal according to a result of correspondence between the ranges and an inputted codeword;*

*comparing a range on the number line of more probable symbols with a fixed value; and*

*adjusting the range on the number line of more probable symbols and the range on the number line of less probable symbols so that when a range of more probable symbols is below the fixed value on a number line, half of a value below the fixed value of a range more probable symbols is moved from the range of less probable symbols to that of more probable symbols.*

*13. A coding method for a Markov information source by binary coding comprising the steps of:*

*associating more probable symbols (symbols of a higher occurrence probability) and less probable symbols (symbols of a lower occurrence probability) to predetermined ranges on a number line on the basis of a range on a number line for a preceding symbols;*

*coding a signal according to a result of correspondence between the ranges to generate a codeword;*

*comparing the range on the number line of more probable symbols with the range on the number line of less probable symbols; and*

*adjusting the range on the number line of less probable symbols and the range on the number line of more probable symbols by assigning a predetermined portion of the range for said less probable symbols above a prescribed value of said number line to said range for said more probable symbols so that the range on the number line of less probable symbols does not exceed that of the more probable symbols.*

*14. A coding method for a Markov information source by binary coding comprising the steps of:*

*associating more probable symbols (symbols of higher occurrence probability) and less probable symbols (symbols of a lower occurrence probability) to predetermined ranges on a number line on the basis of a range on a number line or a preceding symbols;*

*coding a signal according to a result of correspondence between the ranges to generate a codeword;*

*comparing a range on the number line of more probable symbols with a fixed value; and*

*adjusting the range on the number line of more probable symbols and the range on the number line of less probable symbols so that when a range of more probable symbols is below the fixed value on a number line, half of a value below the fixed value of a range of more probable symbols is moved from the range of less probable symbols to that of more probable symbols.*

* * * * *